United States Patent
Prinz et al.

(10) Patent No.: US 10,788,560 B2
(45) Date of Patent: Sep. 29, 2020

(54) VERIFYING SPECIFICATIONS FOR MAGNETIC RESONANCE EXAMINATIONS

(71) Applicants: Carsten Prinz, Baiersdorf (DE); Volker Schnetter, Nuremberg (DE)

(72) Inventors: Carsten Prinz, Baiersdorf (DE); Volker Schnetter, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 729 days.

(21) Appl. No.: 15/430,473

(22) Filed: Feb. 11, 2017

(65) Prior Publication Data

US 2017/0234958 A1 Aug. 17, 2017

(30) Foreign Application Priority Data

Feb. 11, 2016 (DE) .................. 10 2016 202 062

(51) Int. Cl.
| | |
|---|---|
| *G01R 33/58* | (2006.01) |
| *G01R 33/28* | (2006.01) |
| *G01R 33/54* | (2006.01) |
| *G01R 33/385* | (2006.01) |

(52) U.S. Cl.
CPC .......... *G01R 33/58* (2013.01); *G01R 33/288* (2013.01); *G01R 33/385* (2013.01); *G01R 33/543* (2013.01); *G01R 33/285* (2013.01)

(58) Field of Classification Search
CPC .... G01R 33/58; G01R 33/288; G01R 33/543; G01R 33/385
See application file for complete search history.

(56) References Cited

U.S. PATENT DOCUMENTS

| | | | | |
|---|---|---|---|---|
| 5,266,896 | A * | 11/1993 | Rugar | B82Y 35/00 324/300 |
| 6,980,001 | B2 * | 12/2005 | Paley | G01R 33/445 324/318 |
| 7,375,520 | B2 * | 5/2008 | Nezafat | G01R 33/5635 324/307 |
| 8,077,955 | B2 * | 12/2011 | Dannels | G01R 33/246 324/309 |

(Continued)

FOREIGN PATENT DOCUMENTS

| | | |
|---|---|---|
| DE | 19913547 A1 | 11/1999 |
| DE | 602004009052 T2 | 6/2008 |

OTHER PUBLICATIONS

Strohm. "Norme Internationale IEC 60601-2-33." Edition 3.0; 2010. Abstract.

(Continued)

*Primary Examiner* — Dixomara Vargas
(74) *Attorney, Agent, or Firm* — Lempia Summerfield Katz LLC

(57) ABSTRACT

A method for verifying at least one default value for a magnetic resonance examination, a verifying unit, a magnetic resonance device and a computer program product are provided. According to the method, at least one default value for an electromagnetic property and a sequence segment are sent to a verifying unit. The verifying unit uses the sequence segment to determine at least one electromagnetic property. The at least one default value is verified by the verifying unit with respect to the at least one electromagnetic property.

14 Claims, 2 Drawing Sheets

(56) References Cited

U.S. PATENT DOCUMENTS

| | | | |
|---|---|---|---|
| 8,502,538 B2* | 8/2013 | Dannels | G01R 33/243 324/307 |
| 8,901,778 B2* | 12/2014 | Kesler | H02J 50/60 307/104 |
| 9,500,727 B2* | 11/2016 | Sohn | G01R 33/34092 |
| 9,897,679 B2* | 2/2018 | Brinker | G01R 33/583 |
| 10,162,033 B2* | 12/2018 | Feiweier | G01R 33/543 |
| 2004/0164737 A1* | 8/2004 | Feiweier | G01R 33/583 324/309 |
| 2006/0284615 A1* | 12/2006 | Nazafat | G01R 33/5635 324/307 |
| 2007/0010737 A1 | 1/2007 | Harvey et al. | |
| 2007/0108976 A1* | 5/2007 | Morich | G01R 33/583 324/309 |
| 2010/0013479 A1* | 1/2010 | Park | G01R 33/54 324/309 |
| 2010/0090695 A1 | 4/2010 | Kassai | |
| 2010/0239142 A1* | 9/2010 | Dannels | G01R 33/443 382/131 |
| 2010/0308829 A1 | 12/2010 | Vu et al. | |
| 2011/0144474 A1* | 6/2011 | Ouwerkerk | A61B 5/055 600/410 |
| 2013/0082705 A1* | 4/2013 | Landschuetz | G01R 33/565 324/309 |
| 2013/0251227 A1* | 9/2013 | Wang | G01R 35/00 382/131 |
| 2013/0265047 A1* | 10/2013 | Griswold | G01R 33/56 324/309 |
| 2013/0285659 A1* | 10/2013 | Sohn | G01R 33/3456 324/314 |
| 2015/0219739 A1* | 8/2015 | Brinker | G01R 33/58 324/309 |
| 2015/0301141 A1* | 10/2015 | Griswold | G01R 33/5608 382/131 |
| 2015/0301142 A1* | 10/2015 | Griswold | G01R 33/4828 324/309 |
| 2015/0302579 A1* | 10/2015 | Griswold | G01R 33/5608 382/128 |
| 2016/0025835 A1* | 1/2016 | Gulani | A61B 5/0035 600/420 |
| 2016/0116557 A1* | 4/2016 | Feiweier | G01R 33/543 324/309 |
| 2017/0293005 A1* | 10/2017 | Panther | G01R 33/445 |

OTHER PUBLICATIONS

German Office Action for German Application No. 102016202062.5 dated Jun. 23, 2017.

* cited by examiner

VERIFYING SPECIFICATIONS FOR MAGNETIC RESONANCE EXAMINATIONS

This application claims the benefit of DE 10 2016 202 062.5, filed on Feb. 11, 2016, which is hereby incorporated by reference in its entirety.

BACKGROUND

The present embodiments relate to verifying at least one default value for a magnetic resonance examination.

During a magnetic resonance examination (e.g., during the performance of magnetic resonance imaging (MRI)), typically, electromagnetic fields (e.g., gradient fields and radio-frequency fields) are used for the acquisition of magnetic resonance signals by a magnetic resonance device.

To generate the gradient fields, the magnetic resonance device typically includes a gradient coil unit with at least one gradient coil. The magnetic resonance device also generally includes a radio-frequency antenna unit with which the radio-frequency fields may be generated in order to excite atomic nuclei. During a magnetic resonance examination, the gradient coil unit and the radio-frequency antenna unit are typically operated in accordance with a predetermined imaging sequence.

The gradient fields may cause peripheral nerve stimulation (PNS), and the radio-frequency fields may cause heating. Therefore, standardization bodies, such as, for example, IEC 60601-2-33 require such PNS and/or heating to be monitored and limited. In the past, patients with implants were, as a rule, excluded from magnetic resonance examinations. The development of new implants has made it possible for magnetic resonance examinations to be permitted for implant wearers as long as certain boundary conditions are observed.

These boundary conditions may be defined by standardization bodies. This generally entails the maintenance of specific physical properties.

The publication DE 602004009052 T2 discloses a method for simulating electric stimulation in an MRI system, which is expressly limited to a calculation of a stimulation value by filtering gradient signals and comparison with a limit.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method with which imaging sequences for magnetic resonance examinations may be reviewed is provided.

A method for verifying at least one default value for a magnetic resonance examination is provided. The method includes transferring at least one default value for an electromagnetic property and one sequence segment to a verifying unit. The verifying unit uses the sequence segment to determine at least one electromagnetic property. The verifying unit verifies the at least one default value with respect to the at least one electromagnetic property.

The sequence segment may be a complete sequence or a part of a sequence. A sequence may be a temporal sequence of radio-frequency (RF) pulses and/or gradient pulses for the excitation of an image volume to be scanned for the generation and spatial encoding of magnetic resonance signals. Therefore, a sequence may be referred to as a pulse sequence. A sequence may, for example, define a flip angle that typically describes a deflection of magnetization from a longitudinal direction after the end of an RF pulse.

The at least one electromagnetic property may be assigned to a spatial region located within a patient-receiving region (e.g., an image volume) of a magnetic resonance device.

The at least one electromagnetic property may include at least one physical field. This at least one physical field may be static and/or dynamic. For example, the at least one physical field may result from a superimposition of a static field and a dynamic field. The at least one physical field may be an electromagnetic field (e.g., a magnetic field and/or an electric field).

The at least one electromagnetic property may also, for example, contain at least one physical field within a patient-receiving region.

The at least one physical field may be embodied to interact with an object under examination (e.g., a human or animal patient). For example, the at least one physical field may be suitable for effecting a stimulation (e.g., peripheral nerve stimulation) and/or heating (e.g., of a tissue in the object under examination).

For example, the at least one electromagnetic property may be influenced by at least one gradient signal and/or one radio-frequency signal. A gradient signal may, for example, be generated by a gradient coil unit of a magnetic resonance device. A gradient signal may be depicted by at least one gradient pulse and a radio-frequency signal by an RF pulse within the sequence segment.

The at least one default value may be set such that, when the default value is observed, the risk of damage and/or injury to the object under examination is reduced (e.g., excluded). In one embodiment, the at least one default value is specified by a standard such as, for example, IEC 60601-2-33.

The at least one default value takes account of any possible use of an implant within the object under examination. In one embodiment, the verification of the at least one default value takes account of a fixed-parameter option (FPO). This option may be switched additionally to established modes of operation and typically defines a fixed configuration of the device and specific parameters of the energy output from magnetic resonance devices. This enables a magnetic resonance examination on implant patients to be simplified.

The method may enable all physical parameters to be monitored that are specified by standardization bodies to be determined before a magnetic resonance examination (e.g., a scan) and, for example, before the development of a sequence. For example, the at least one default value may be adapted.

One embodiment of the method provides that the at least one default value contains a $B_1^+$ value (e.g., an effective $B_1^+$ value, $B_1^+{}_{rms}$, and/or maximum $B_1^+$ value, $B_1^+{}_{peak}$). These default values are advantageous since the default values are specified in the standard IEC 60601-2-33, Edition 3.2. 2015-06.

An effective value may, for example, be a root mean square (RMS) of a time-variable physical parameter. A maximum value may, for example, be a peak of a time-variable physical parameter.

The $B_1^+$ value typically describes a field strength of a $B_1^+$ field. The $B_1^+$ field may be interpreted as a component of a magnetic radio-frequency field. This component typically rotates in a plane aligned perpendicular to a static basic magnetic field of the magnetic resonance device. In many magnetic resonance devices, the static basic magnetic field is generated by a superconducting coil. The direction in which the static basic magnetic field is aligned is generally defined as the z-direction. Assuming that together with the z-direction, an x-direction and a y-direction form an orthogonal coordinate system, $B_1^+$ may be described with $B_1^+ = (B_x + iB_y)/2$.

Provided that the sequence segment defines a specific flip angle so that a defined $B_1^+$ field is provided, it is simple to determine the electromagnetic property of the effective $B_1^+$ value, $B_{1\ rms}^+$, and/or maximum $B_1^+$ value, $B_{1\ peak}^+$, assigned to the default value.

One embodiment of the method provides that the at least one default value contains a, for example, temporal rate of change of a B value dB/dt (e.g., an effective rate of change $dB/dt_{rms}$, and/or a value $|dB/dt|_{rms}$, and/or a maximum rate of change $dB/dt_{peak}$ of a B value and/or an amount $|dB/dt|_{peak}$. These default values are advantageous since the default values are specified in the standard IEC 60601-2-33, Edition 3.2. 2015-06.

The temporal rate of change of the B value may describe a rate of change of a magnetic field strength and may be described with the derivative dB/dt of the magnetic field strength B according to the time t.

The at least one electromagnetic property may contain a magnetic field strength. From this, it is, for example, possible to determine a rate of change of the B value so that a specified rate of change of the B value may be verified.

One embodiment of the method provides that a maximum of the magnetic field strength is determined by measurement and/or simulation calculation.

In one embodiment, the magnetic field strength of at least one (e.g., each) gradient axis to be determined. A magnetic resonance device may include three gradient axes. As a rule, each gradient axis is assigned a gradient coil that is able to generate a magnetic field gradient parallel to the gradient axis. The gradient fields generated thereby are generally aligned orthogonally. For example, a first gradient coil may generate a gradient field in the x-direction, a second gradient coil may generate a gradient field in the y-direction, and a third gradient coil may generate a gradient field in the z-direction.

The magnetic field strength, which is created by the actuation of each gradient axis, may be determined for each spatial point (e.g., each spatial point of a patient-receiving region or a part thereof). A, superimposition (e.g., vectorial superimposition) of the magnetic field strengths of a plurality of (e.g., all) gradient axes then enables a superimposed magnetic field strength to be determined for each spatial point.

The one or more magnetic field strengths may be determined as a function of time. Hence, based on the B value formed at every actuation time point, the rate of change of the B value dB/dt may be calculated therefrom, and the peak $dB/dt_{peak}$, and/or the effective value $dB/dt_{rms}$, and/or the amounts $|dB/dt|_{peak}$, and/or $|dB/dt|_{rms}$ may be determined therefrom.

One embodiment of the method provides that the verification of the sequence segment is adapted as a function of a result. Since, following the verification of the at least one default value with respect to the at least one electromagnetic property, it is known whether the at least one default value was exceeded, this information may be used to adapt the sequence such that the at least one default value is observed.

Also provided is a verifying unit embodied to carry out a method for verifying at least one default value for a magnetic resonance examination. The verifying unit may, for example, include one or more processors and/or a memory.

The advantages of the device according to one or more of the present embodiments for verifying at least one default value for a magnetic resonance examination substantially correspond to the advantages of the method according to one or more of the present embodiments for verifying at least one default value for a magnetic resonance examination, which are described above in the detail. Any features, advantages, or alternative embodiments may also be transferred to the other subject matter and vice versa.

The verifying unit may, for example, be embodied to be integrated in a magnetic resonance device and/or include a data interface embodied to transfer data to a magnetic resonance device. In one embodiment, the verifying unit may work independently of a magnetic resonance device.

Also provided is a magnetic resonance device with a verifying unit that is embodied to carry out a method for verifying at least one default value for a magnetic resonance examination. The magnetic resonance device may, for example, include a system control unit for controlling the magnetic resonance device, which includes the verifying unit.

Also provided is a computer program product that includes a program and may be loaded directly into a memory (e.g., a non-transitory computer-readable storage medium) of a programmable computing unit of a verifying unit and program instructions (e.g., libraries and auxiliary functions) for carrying out a method for verifying at least one default value for a magnetic resonance examination when the computer program product is executed in the verifying unit. In this context, the computer program product may include software with a source code that still is to be compiled and linked or only is to be interpreted. Alternatively, the computer program product may include an executable software code that is to be loaded into the verifying unit for execution. The computer program product enables the method for verifying at least one default value for a magnetic resonance examination to be carried out quickly, identically repeatably, and robustly. The computer program product is configured such that it is able to carry out the method acts according to one or more of the present embodiments by the verifying unit. In this case, the verifying unit is in each case to fulfill the requisite (e.g., include an appropriate user memory, an appropriate graphics card, or an appropriate logic unit so that the respective method acts may be carried out efficiently).

The computer program product is, for example, stored on a computer-readable medium or on a network or server from where the computer program product may be loaded into the processor of a local verifying unit, which may be directly connected to the acquisition-sample-generation unit or embodied as part of the verifying unit. In one embodiment, control information of the computer program product may be stored on an electronically readable data medium. The control information of the electronically readable data medium may be embodied such that the control information carries out a method according to one or more of the present embodiments when the data medium is used in a verifying unit. Examples of electronically readable data media are a DVD, a magnetic tape, or a USB stick on which electronically readable control information (e.g., software, instructions) is stored. When this control information is read from the data medium and stored in a verifying unit, all the embodiments according to one or more of the present embodiments of the above-described methods may be carried out. For example, one or more of the present embodiments may also be based on the computer-readable medium or the electronically readable data medium.

DETAILED DESCRIPTION

Figure 1:
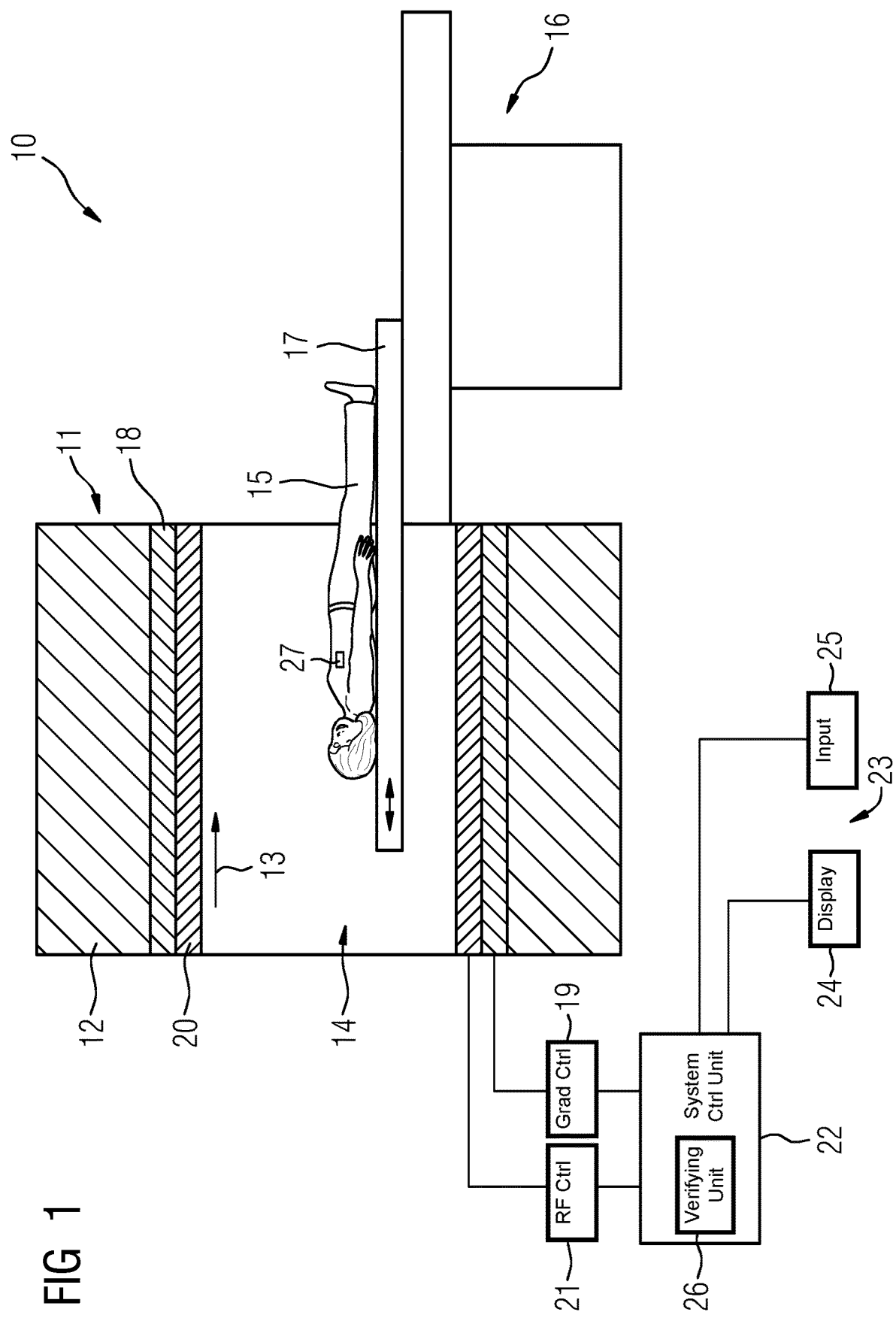
FIG. 1 is a schematic representation of one embodiment of a magnetic resonance device with a verifying unit.

FIG. 1 is a schematic representation of one embodiment of a magnetic resonance device 10. The magnetic resonance device 10 includes a magnet unit 11 having a superconducting basic magnet 12 to generate a strong and, for example, temporally constant basic magnet field 13. The magnetic resonance device 10 also includes a patient-receiving region 14 for receiving a patient 15. In this case, the patient 15 has an implant 27. In the present exemplary embodiment, the patient-receiving region 14 has a cylindrical shape and is surrounded in a circumferential direction by the magnet unit 11. However, in principle, an embodiment of the patient-receiving region 14 deviating therefrom may be provided at any time. The patient 15 may be pushed into the patient-receiving region 14 by a patient support device 16 of the magnetic resonance device 10. To this end, the patient support device 16 includes a patient table 17 embodied movably within the patient-receiving region 14.

The magnet unit 11 further includes a gradient coil unit 18 for the generation of magnetic field gradients that are used for spatial encoding during imaging. The gradient coil unit 18 is controlled by a gradient control unit 19 of the magnetic resonance device 10. The gradient coil unit 19 includes three gradient coils (not shown in detail in FIG. 1) that are each embodied to generate a gradient field parallel to a gradient axis with the aid of a gradient signal. The magnet unit 11 further includes a radio-frequency antenna unit 20 that, in the exemplary embodiment, is configured as a body coil that is permanently integrated in the magnetic resonance device 10. The radio-frequency antenna unit 20 is configured for the excitation of atomic nuclei established in the basic magnetic field 13 by the basic magnet 12 with the aid of radio-frequency signals. The radio-frequency antenna unit 20 is controlled by a radio-frequency control unit 21 of the magnetic resonance device 10 and irradiates radio-frequency magnetic-resonance frequencies into an examination chamber substantially formed by a patient-receiving region 14 of the magnetic resonance device 10. The radio-frequency antenna unit 20 is also embodied to receive magnetic resonance signals.

To control the basic magnet 12 and to control the radio-frequency control unit 21, the gradient control unit 19 and the magnetic resonance device 10 respectively include a system control unit 22. The system control unit 22 controls the magnetic resonance device 10 centrally (e.g., for the performance of a predetermined imaging pulse sequence). The system control unit 22 includes an evaluation unit (not shown in further detail) for the evaluation of medical image data acquired during the magnetic resonance examination. The magnetic resonance device 10 also includes a user interface 23 connected to the system control unit 22. Control information such as, for example, imaging parameters, and reconstructed magnetic resonance images may be displayed on a display unit 24 (e.g., on at least one monitor, the user interface 23 for a medical operator). The user interface 23 also includes an input unit 25 by which the medical operator may input information and/or parameters during a scanning process.

The magnetic resonance device 10 also includes a verifying unit 26 with a computing unit (e.g., a computing device) including, for example, one or more processors and/or a memory (e.g., a non-transitory computer-readable storage medium) for carrying out a method for verifying at least one default value for a magnetic resonance examination. A program with program instructions for carrying out a method for verifying at least one default value for a magnetic resonance examination when the program is executed in the computing unit may be loaded into the memory of the programmable computing unit.

Figure 2:
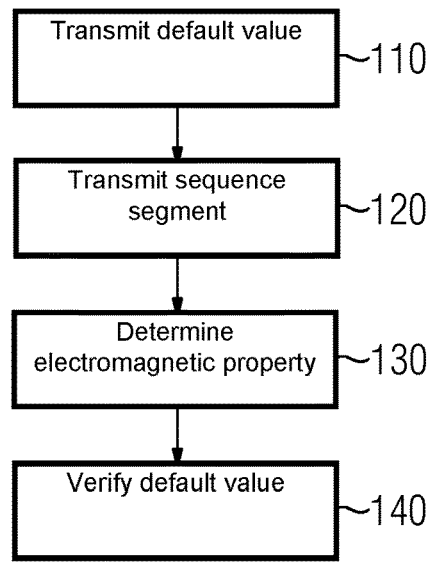
FIG. 2 is a block diagram of one embodiment of a method.

FIG. 2 is a block diagram illustrating one possible method for verifying at least one default value for a magnetic resonance examination. In act 110, at least one default value for an electromagnetic property and in act 120 a sequence segment are transmitted to the verifying unit 26. To carry out the acts 110 and/or 120, the system control unit 22 may, for example, include a database in which the at least one default value and/or the sequence segment is stored.

The at least one default value may be specified by a standard (e.g., for patients 15 with an implant 27). The at least one default value may also contain a $B_1^+$ value (e.g., an effective and/or maximum $B_1^+$ value), and/or a rate of change of a B value (e.g., an effective and/or maximum rate of change of a B value).

In act 130, at least one electromagnetic property is determined using the sequence segment with the aid of the verifying unit 26.

The at least one electromagnetic property may be influenced by at least one gradient signal and/or a radio-frequency signal. The electromagnetic property may, for example, contain a magnetic field strength. For example, a maximum of the magnetic field strength may be determined by measuring and/or simulation calculation.

In act 140, the at least one default value is verified with respect to the at least one electromagnetic property with the aid of the verifying unit 26.

In an optional further act, which is not shown in further detail here, the verification of the sequence segment is optionally adapted as a function of a result.

Figure 3:
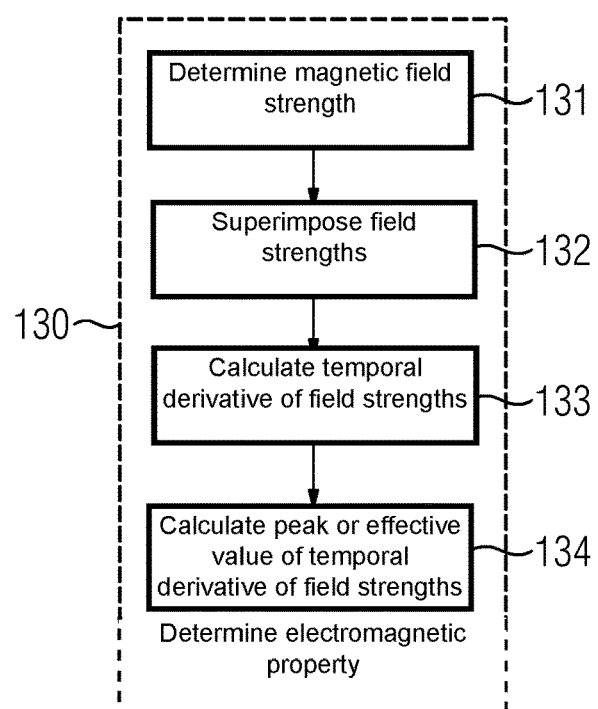
FIG. 3 is a detailed block diagram of a part of a method according to an embodiment.

FIG. 3 shows by way of example the determination of a rate of change of a B value, which may be performed within the context of step 130. In act 131, a magnetic field strength is determined for each gradient axis of the gradient coil unit 18. This is advantageously performed for each spatial point of the patient-receiving region 14 (e.g., for the part of the patient-receiving region in which the patient 15 is located). In act 132, the magnetic field strengths determined in act 131 are vectorially superimposed. The determination of the magnetic field strengths in act 131 and corresponding superimposition in act 131 is performed as a function of time, so that the temporal derivation of the magnetic field strength dB/dt may be calculated in act 133. The amount of a peak $|dB/dt|_{peak}$ and/or effective value $|dB/dt|_{rms}$ is calculated in act 134.

The method described in detail above and the verifying unit and magnetic resonance device shown are only exemplary embodiments that may be modified by the person skilled in the art in wide variety of ways without leaving the scope of the invention. The use of the indefinite article "a" or "an" does not exclude the possibility of the features in question being present a number of times. The term "unit" does not exclude the possibility of the unit including a plurality of interacting components that may also be spatially distributed.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for verifying one or more default values prior to a magnetic resonance examination, wherein the method comprises:
   transmitting at least one default value of at least one electromagnetic property to a verifying unit, wherein the verifying unit comprises a computing device, and wherein the at least one electromagnetic property comprises a measure of a magnetic field strength, an electric field strength, or the magnetic field strength and the electric field strength;
   transmitting a sequence segment of a radiofrequency pulse sequence to the verifying unit;
   determining, by the verifying unit, a value of the at least one electromagnetic property based on the sequence segment, wherein determining the value of the at least one electromagnetic property comprises simulating the value;
   verifying, by the verifying unit, whether the value of the at least one electromagnetic property exceeds the at least one default value; and
   adapting, when the value of the at least one electromagnetic property exceeds the at least one default value, the sequence segment such that the at least one electromagnetic property observes the at least one default value, and a result of the adapting is an adapted sequence segment,
   wherein the magnetic resonance examination is performed using the adapted sequence segment,
   wherein the at least one default value contains a rate of change of a B value, and
   wherein the rate of change of the B value is based on a magnetic field strength of a gradient field generatable by one or more gradient coils as a function of time.

2. The method of claim 1, wherein the at least one electromagnetic property is influenced by at least one gradient signal, a radio-frequency signal, or the at least one gradient signal and the radio-frequency signal.

3. The method of claim 1, wherein the at least one default value is specified by a standard.

4. The method of claim 1, wherein the at least one default value contains a B1+ value.

5. The method of claim 1, wherein a maximum of the magnetic field strength, the electric field strength, or the magnetic field strength and the electric field strength is determined by measurement, simulation, or measurement and simulation calculation.

6. The method of claim 1, wherein the magnetic field strength, the electric field strength, or the magnetic field strength and the electric field strength of at least one gradient axis is determined.

7. The method of claim 6, wherein magnetic field strengths, electric field strengths, or the magnetic field strengths and the electric field strengths of a plurality of gradient axes are superimposed.

8. The method of claim 1, wherein the magnetic field strength, the electric field strength, or the magnetic field strength and the electric field strength are determined as a function of time.

9. A verifying unit for verifying one or more default values for a magnetic resonance examination, at least one default value of at least one electromagnetic property and a sequence segment being transmittable to the verifying unit, the verifying unit comprising;
   a computing device configured to:
      determine a value of the at least one electromagnetic property based on the sequence segment, wherein the at least one electromagnetic property comprises a measure of a magnetic field strength, an electric field strength, or the magnetic field strength and the electric field strength, and wherein the determination of the value of the at least one electromagnetic property comprises simulation of the value;
      verify whether the value of the at least one electromagnetic property exceeds the at least one default value; and
      adapt, when the value of the at least one electromagnetic property exceeds the at least one default value, the sequence segment such that the at least one electromagnetic property observes the at least one default value, and a result of the adaptation is an adapted sequence segment,
   wherein the magnetic resonance examination is performed using the adapted sequence segment,
   wherein the at least one default value contains a rate of change of a B value, and
   wherein the rate of change of the B value is based on a magnetic field strength of a gradient field generatable by one or more gradient coils as a function of time.

10. The verifying unit of claim 9, wherein the at least one electromagnetic property is influenced by at least one gradient signal, a radio-frequency signal, or the at least one gradient signal and the radio-frequency signal.

11. The verifying unit of claim 9, wherein the at least one default value is specified by a standard.

12. The verifying unit of claim 9, wherein the at least one default value contains a B1+ value.

13. A magnetic resonance device comprising:
   a verifying unit for verifying one or more default values for a magnetic resonance examination, at least one default value of at least one electromagnetic property and a sequence segment being transmittable to the verifying unit, the verifying unit comprising;
   a computing device configured to:
      determine a value of the at least one electromagnetic property based on the sequence segment, wherein the at least one electromagnetic property comprises a measure of a magnetic field strength, an electric field strength, or the magnetic field strength and the electric field strength, and wherein the determination of the value of the at least one electromagnetic property comprises simulation of the value;

verify whether the value of the at least one electromagnetic property exceeds the at least one default value;

adapt, when the value of the at least one electromagnetic property exceeds the at least one default value, the sequence segment such that the at least one electromagnetic property observes the at least one default value, and a result of the adaptation is an adapted sequence segment; and provide the adapted sequence segment for performing the magnetic resonance examination, wherein the at least one default value contains a rate of change of a B value, and wherein the rate of change of the B value is based on a magnetic field strength of a gradient field generatable by one or more gradient coils as a function of time.

14. In a non-transitory computer-readable storage medium storing instructions executable by a computing device of a verifying unit to verify one or more default values for a magnetic resonance examination, the instructions comprising:

transmitting at least one default value of at least one electromagnetic property to the verifying unit, wherein the at least one electromagnetic property comprises a measure of a magnetic field strength, an electric field strength, or the magnetic field strength and the electric field strength;

transmitting a sequence segment of a radiofrequency pulse sequence to the verifying unit;

determining, by the verifying unit, a value of the at least one electromagnetic property based on the sequence segment, wherein determining the value of the at least one electromagnetic property comprises; simulating the value;

verifying, by the verifying unit, whether the value of the at least one electromagnetic property exceeds the at least one default value; and adapting, when the value of the at least one electromagnetic property exceeds the at least one default value, the sequence segment such that the at least one electromagnetic property observes the at least one default value, and a result of the adapting is an adapted sequence segment, wherein the magnetic resonance examination is performed using the adapted sequence segment, wherein the at least one default value contains a rate of change of a B value, and wherein the rate of change of the B value is based on a magnetic field strength of a gradient field generatable by one or more gradient coils as a function of time.

* * * * *